(12) United States Patent
Cole et al.

(10) Patent No.: US 8,532,157 B2
(45) Date of Patent: Sep. 10, 2013

(54) CAPPING METHOD FOR LASER DIODE PROTECTION

(75) Inventors: Douglas Cole, Burnsville, MN (US); Lijuan Zhong, Eden Prairie, MN (US); Roger Lee Hipwell, Jr., Eden Prairie, MN (US); Joseph Michael Stephan, Eden Prairie, MN (US); Scott Eugene Olson, Eagan, MN (US); Tanya Jegeris Snyder, Edina, MN (US); Yongjun Zhao, Eden Prairie, MN (US)

(73) Assignee: Seagate Technology LLC, Cupertino, CA (US)

( * ) Notice: Subject to any disclaimer, the term of this patent is extended or adjusted under 35 U.S.C. 154(b) by 388 days.

(21) Appl. No.: 13/031,667

(22) Filed: Feb. 22, 2011

(65) Prior Publication Data

US 2012/0044967 A1 Feb. 23, 2012

Related U.S. Application Data

(60) Provisional application No. 61/307,151, filed on Feb. 23, 2010.

(51) Int. Cl.
*H01S 3/08* (2006.01)
(52) U.S. Cl.
USPC ............................. 372/108; 372/92
(58) Field of Classification Search
USPC .................................... 372/108, 92
See application file for complete search history.

(56) References Cited

U.S. PATENT DOCUMENTS

| 5,140,569 | A | 8/1992 | Nebashi |
| 6,741,526 | B1 | 5/2004 | Fujiie et al. |
| 6,807,131 | B1 * | 10/2004 | Hesselink et al. ......... 369/13.13 |
| 2003/0112542 | A1 * | 6/2003 | Rettner et al. .................. 360/59 |
| 2006/0187564 | A1 | 8/2006 | Sato et al. |
| 2008/0107377 | A1 | 5/2008 | Cho et al. |
| 2008/0232225 | A1 | 9/2008 | Cho et al. |
| 2009/0266789 | A1 | 10/2009 | Shimazawa et al. |
| 2010/0328807 | A1 | 12/2010 | Snyder et al. |

OTHER PUBLICATIONS

U.S. Appl. No. 61/330,067, filed Apr. 30, 2010, Goulakov et al.
U.S. Appl. No. 13/020,253, filed Feb. 3, 2011, Peng et al.

* cited by examiner

*Primary Examiner* — Kinam Park

(57) ABSTRACT

A method includes: positioning a laser in the cavity in an end of a slider, wherein the laser has an output facet positioned adjacent to a first wall of the cavity to define a first gap between the output facet and the first wall of the cavity, and filling at least a portion of the first gap adjacent to the output facet. An apparatus including a slider including a cavity in a trailing end of the slider, a laser positioned in the cavity and having an output facet positioned adjacent to a first wall of the cavity to define a first gap between the output facet and the first wall of the cavity, and a sealing material filling at least a portion of the first gap adjacent to the output facet is also provided.

11 Claims, 16 Drawing Sheets

CAPPING METHOD FOR LASER DIODE PROTECTION

CROSS-REFERENCE TO A RELATED APPLICATION

Figure 1:
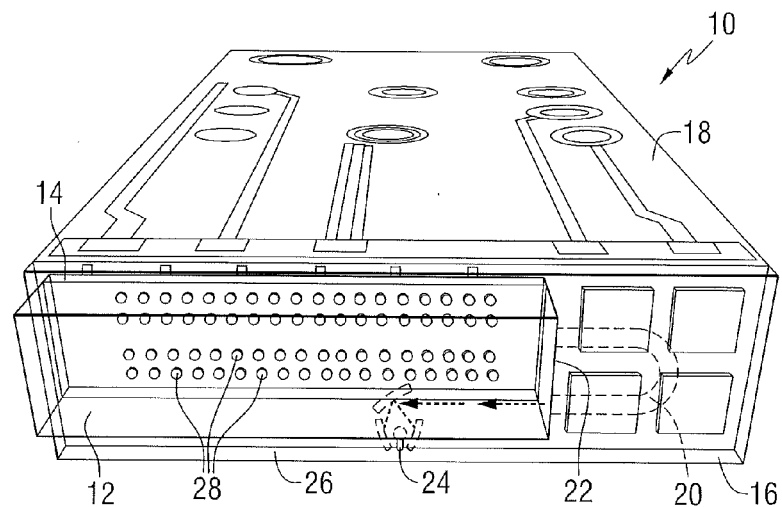

This application claims the benefit of U.S. Provisional Patent Application Ser. No. 61/307,151, filed Feb. 23, 2010, and titled "Capping Method For Laser Diode Protection", which is hereby incorporated by reference.

BACKGROUND

Heat assisted magnetic recording (HAMR) generally refers to the concept of locally heating a recording media to reduce the coercivity of the media so that an applied magnetic writing field can more easily direct the magnetization of the media during the temporary magnetic softening of the media caused by the heat source. A tightly confined, high power laser light spot can be used to heat a portion of the recording media. Then the heated portion is subjected to a magnetic field that sets the direction of magnetization of the heated portion. With HAMR, the coercivity of the media at ambient temperature can be much higher than the coercivity during recording, thereby enabling stability of the recorded bits at much higher storage densities and with much smaller bit cells.

A significant consideration for heat assisted magnetic recording is the location of a laser diode that is used as the optical power source. One current design integrates a laser diode into the trailing edge of the slider and uses a waveguide coupler to guide the laser to the near field transducer using a combination of light-positioning elements such as solid immersion minors (SIMS) and/or channel waveguides.

Integrating laser diodes into a HAMR slider have been described using methods such as solder self alignment and optical couplers. In certain embodiments, a recessed cavity is created on the trailing edge of the read/write head for the laser diode to be precisely attached such that the output of the laser diode interfaces with the correct optical waveguide/recording head layers. One key challenge in the processing of laser-in-slider type read/write heads relates to providing a protection mechanism between the laser diode output and outside particle and chemical contamination. This is particularly challenging when the diode is in a cavity and the geometrical gaps between the diode and cavity are not constant. The gap between a laser diode and an optical coupler is typically required to be less than 1 micron while the gaps around other areas of the laser in a cavity may be several to tens of microns to allow for effective assembly space. This creates a challenge in universally sealing the interfaces around a laser diode.

SUMMARY

In one aspect, the disclosure provides an apparatus including a slider including a cavity in a trailing end of the slider, a laser positioned in the cavity and having an output facet positioned adjacent to a first wall of the cavity to define a first gap between the output facet and the first wall of the cavity, and a sealing material filling at least a portion of the first gap adjacent to the output facet.

These and other features and advantages which characterize the various embodiments of the present disclosure can be understood in view of the following detailed discussion and the accompanying drawings.

DRAWINGS

Figure 2:
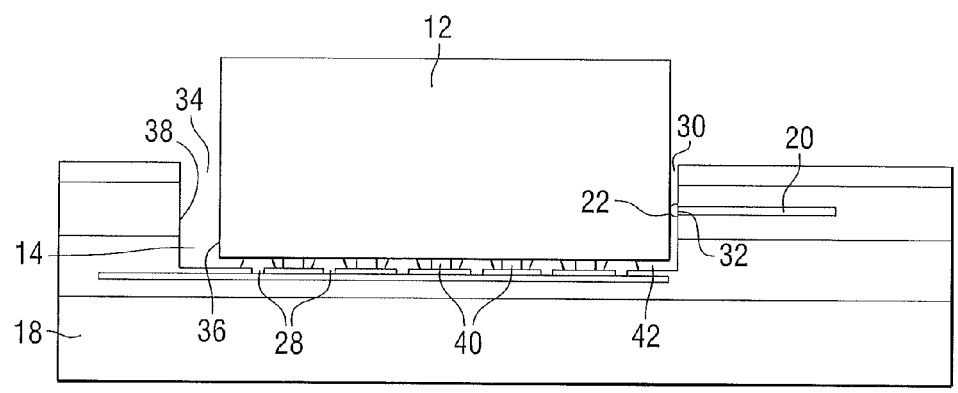
Figure 3:
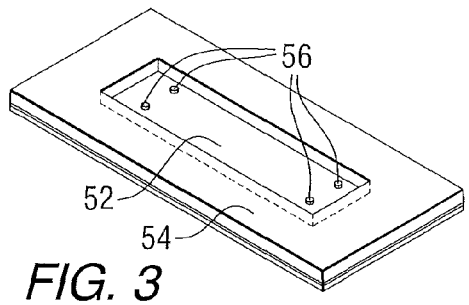
Figure 4:
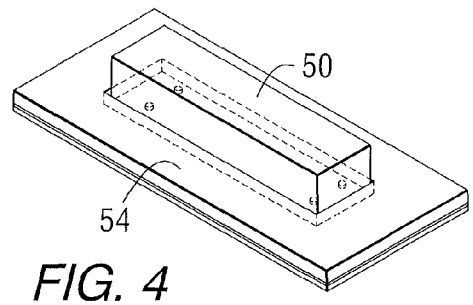
Figure 5:
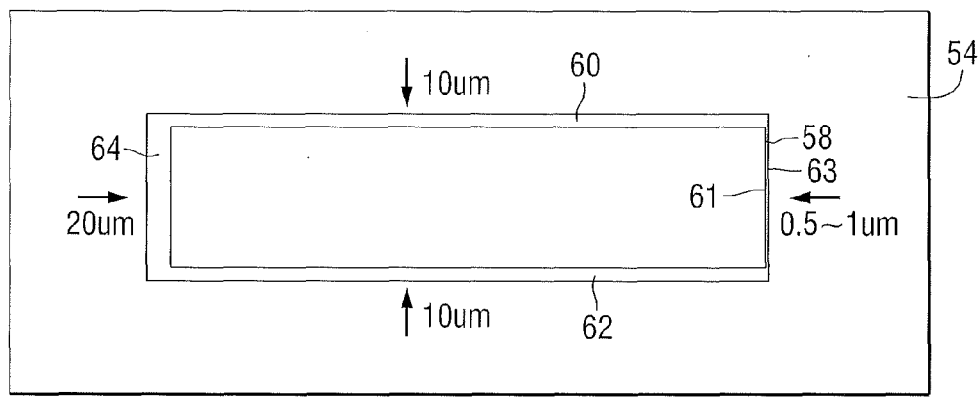
Figure 6:
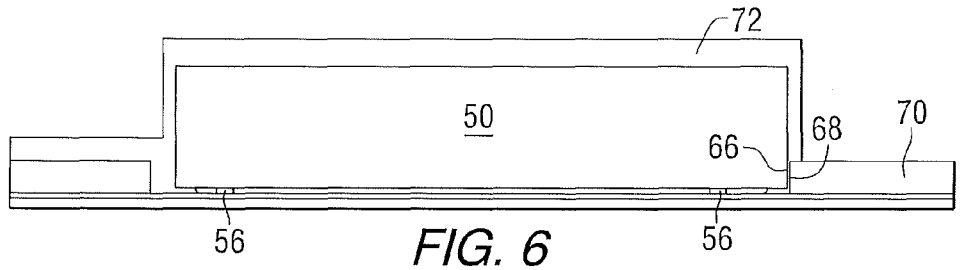
Figure 7:
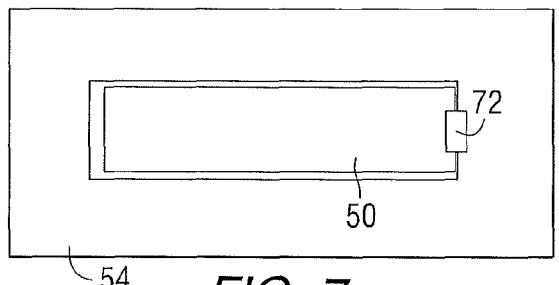
Figure 8:
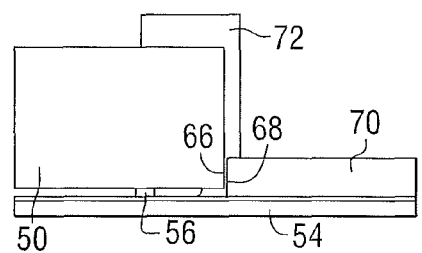
Figure 9:
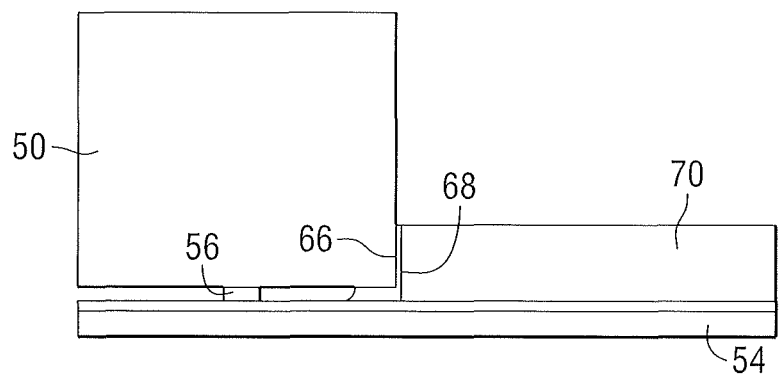
Figure 10:
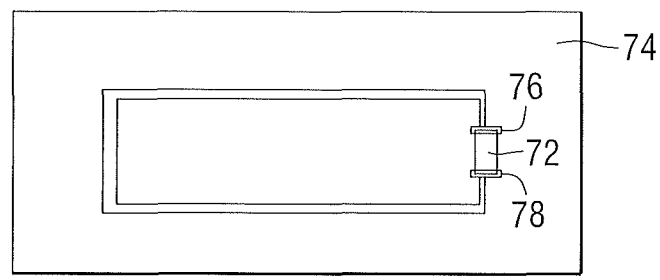
Figure 11:
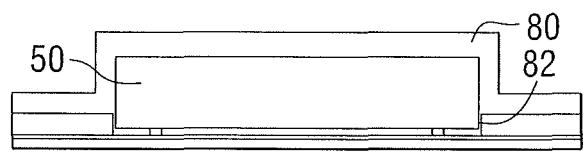
Figure 12:
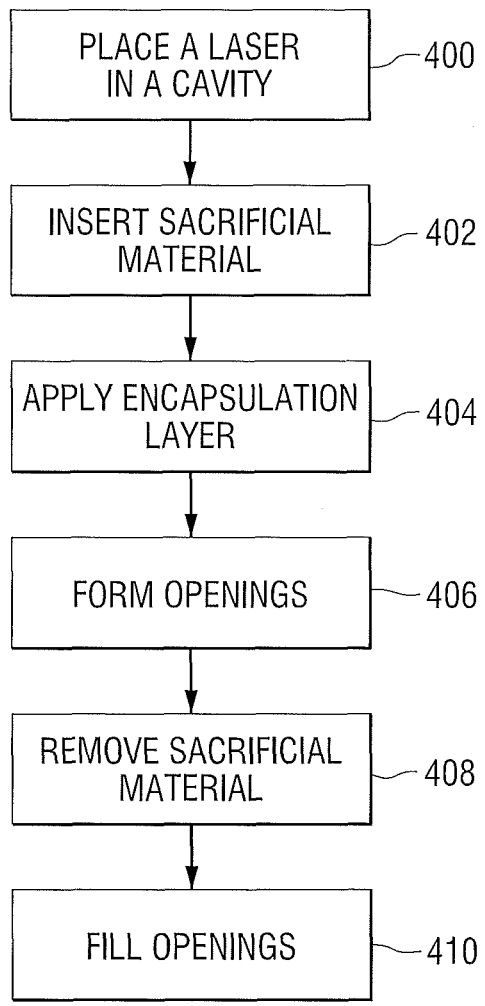
Figure 13:
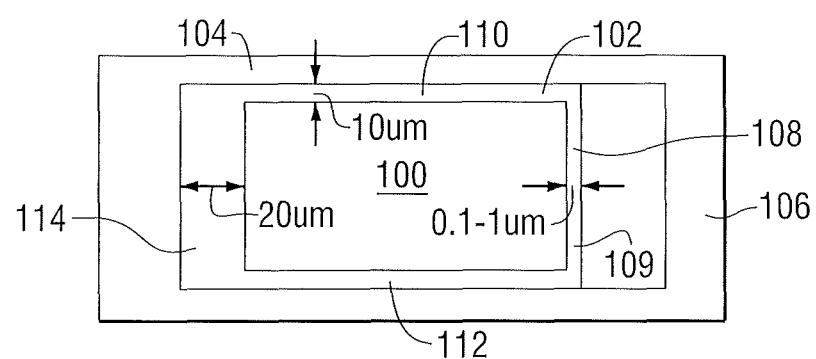
Figure 14:
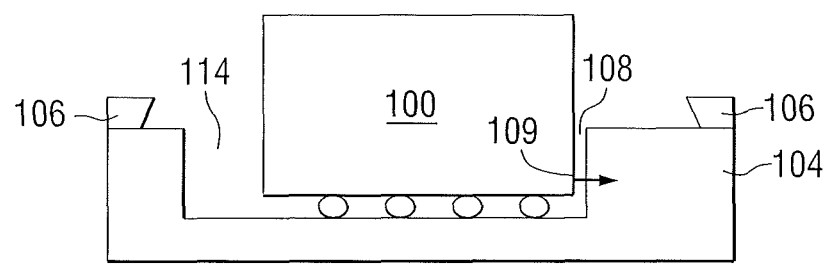
Figure 15:
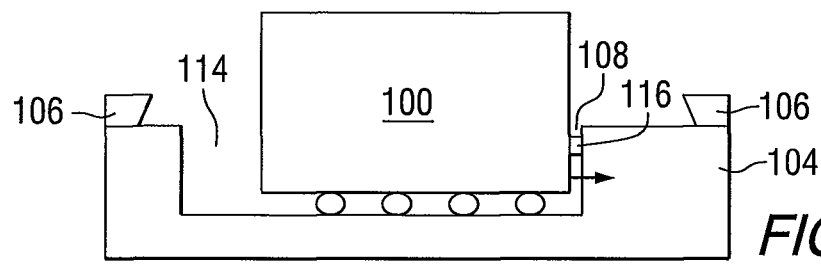
Figure 16:
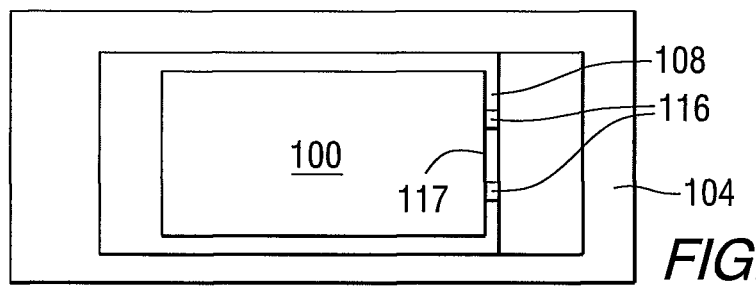
Figure 17:
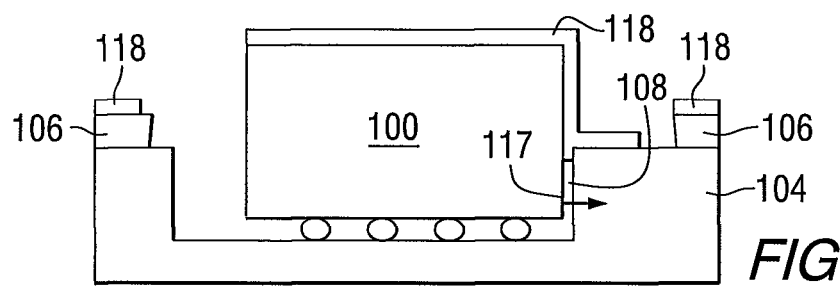
Figure 18:
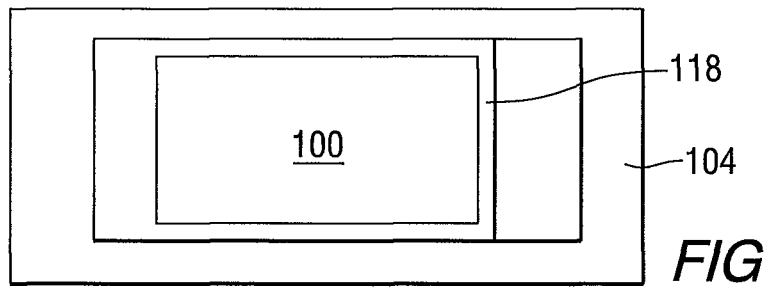
Figure 19:
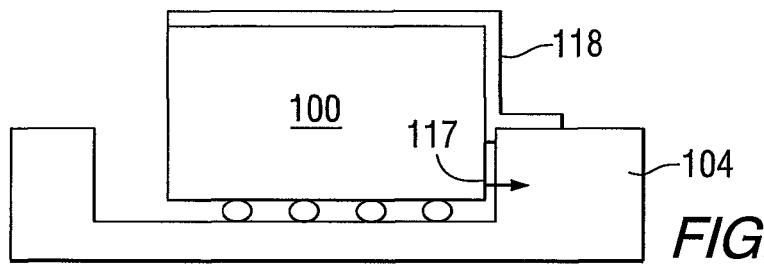
Figure 20:
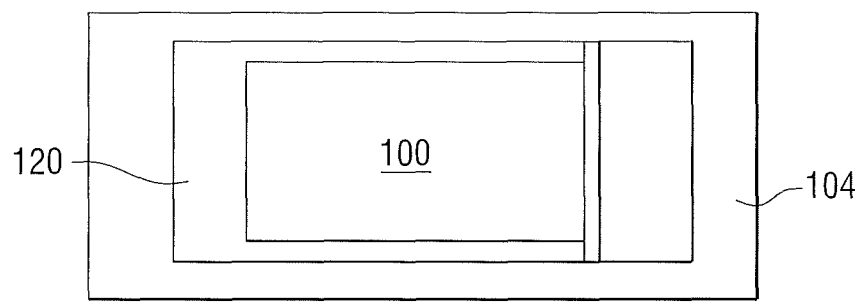
Figure 21:
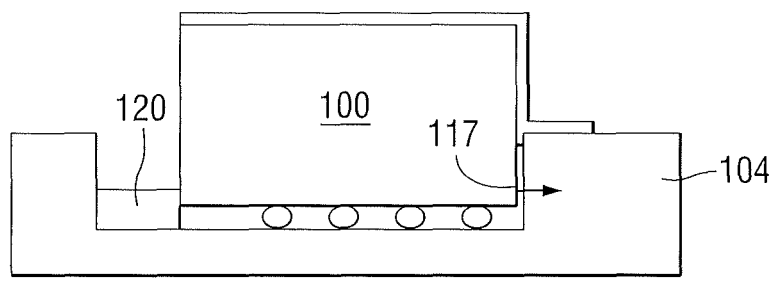
Figure 22:
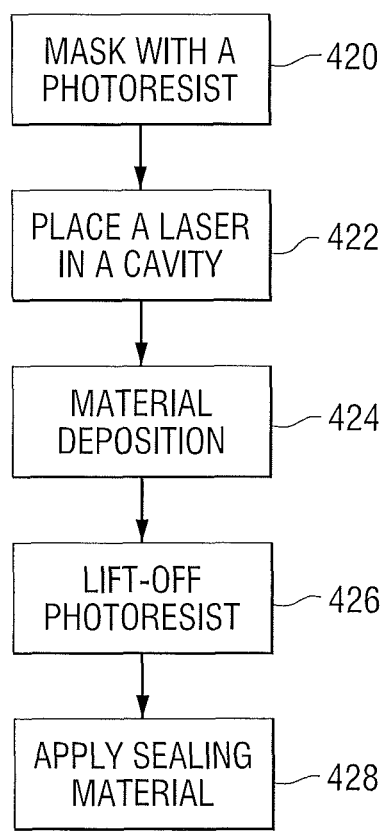
Figure 23:
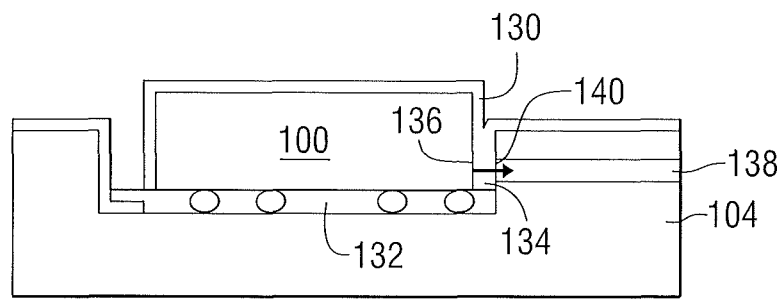
Figure 35:
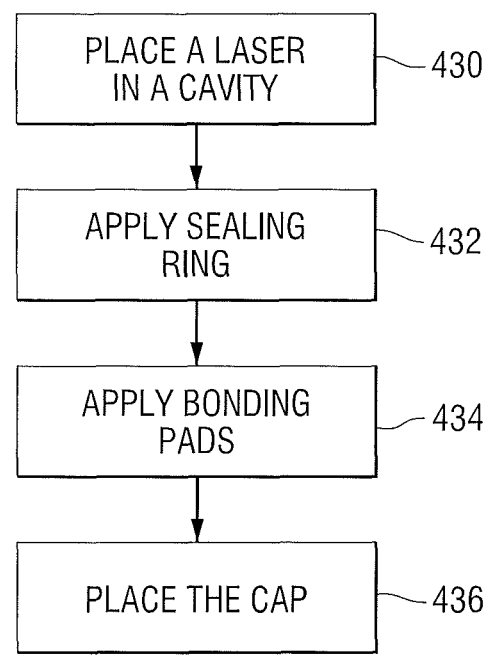
Figure 36:
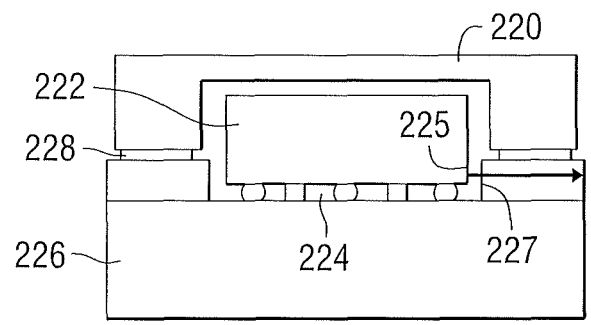
Figure 42:
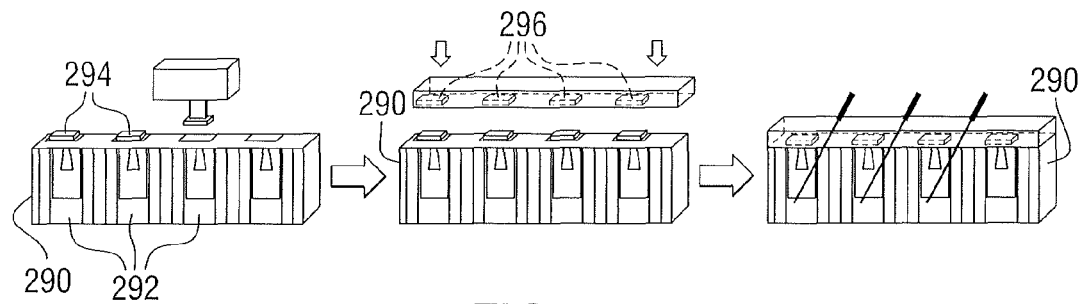
Figure 43:
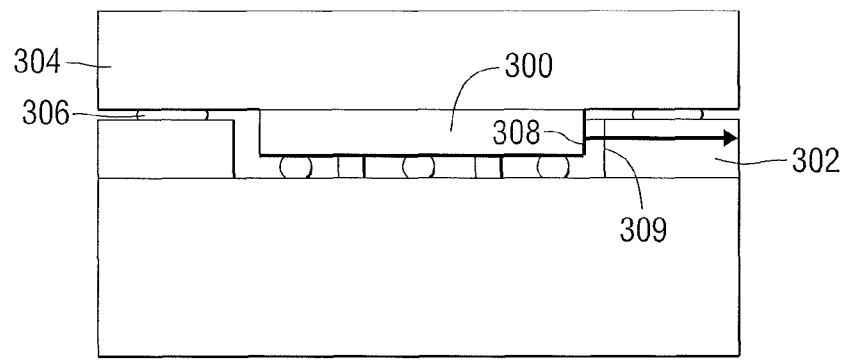
Figure 44:
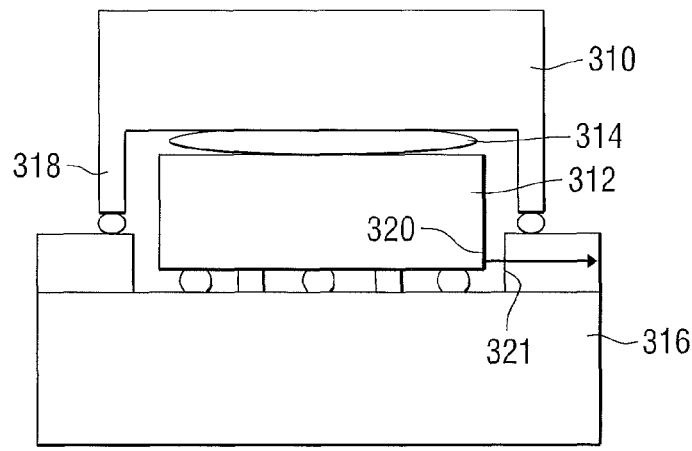
Figure 45:
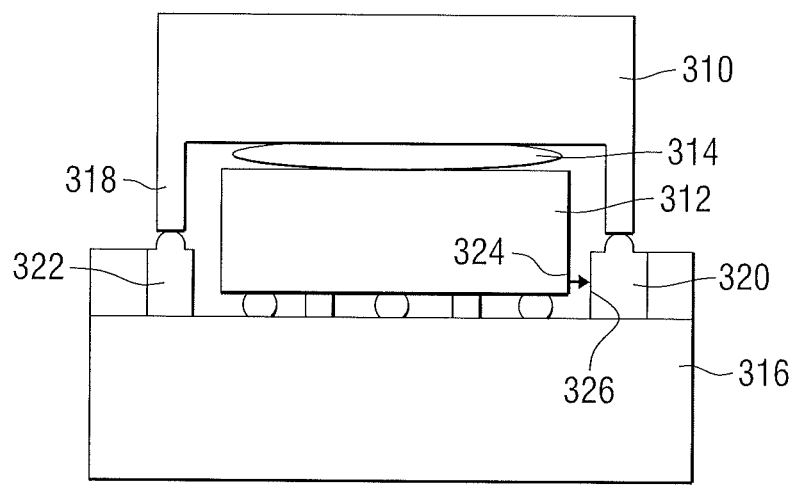

FIG. 1 is an isometric view of a slider.
FIG. 2 is a cross-sectional view of a portion of the slider of FIG. 1.
FIG. 3 is a schematic representation of an end of a slider.
FIG. 4 is a schematic representation of an end of a slider with a laser.
FIG. 5 is a plan view of an end of a slider.
FIG. 6 is an elevation view of a laser in a cavity.
FIG. 7 is a plan view of an end of a slider.
FIGS. 8 and 9 are elevation views of a laser in a cavity.
FIG. 10 is a plan view of an end of a slider.
FIG. 11 is an elevation view of a laser in a cavity.
FIG. 12 is a flowchart of a process for mounting a laser in a slider.
FIG. 13 is a plan view of an end of a slider.
FIGS. 14 and 15 are elevation views of a laser in a cavity.
FIG. 16 is a plan view of an end of a slider.
FIG. 17 is an elevation view of a laser in a cavity.
FIG. 18 is a plan view of an end of a slider.
FIG. 19 is an elevation view of a laser in a cavity.
FIG. 20 is a plan view of an end of a slider.
FIG. 21 is an elevation view of a laser in a cavity.
FIG. 22 is a flowchart of a process for mounting a laser in a slider.
FIGS. 23 through 33 are elevation views of a laser in a cavity.
FIG. 34 is a plan view of an end of a slider.
FIG. 35 is an elevation view of a laser in a cavity.
FIG. 36 is a flowchart of a process for mounting a laser in a slider.
FIGS. 37 through 41 are elevation views of a laser in a cavity.
FIG. 42 is a schematic representation of a process for making sliders.
FIGS. 43, 44 and 45 are elevation views of a laser in a cavity.

DETAILED DESCRIPTION

In one aspect, the disclosure provides methods and apparatus for protecting and/or encapsulating integrated laser diodes in heat-assisted magnetic recording read/write heads. The methods are based on bar-level, chunk-level, or wafer-level processing methods and involve deposition or coating layers that create a protection barrier. One method utilizes sacrificial materials. Another method uses directional deposition to seal the top of the narrow trench between the output laser facet and an optical coupling input. Another method utilizes conformal deposition of an optically preferred material to fill the interface between the laser diode output and the optical coupler input. The methods described below protect the laser (including the laser output facet) from particle and chemical contamination and damage by preventing particle, liquid, and gas contamination from reaching the laser facet.

FIG. 1 is an isometric view of integrated laser-in-slider read/write head 10 for heat assisted magnetic recording. A laser diode 12 is mounted in a cavity 14 in a trailing end 16 of a slider 18. An optical waveguide 20 is positioned in the slider adjacent to the trailing end. Light produced by the laser diode exits the output facet 22, is coupled into the waveguide, and is transmitted to a read/write head 24. The read/write head concentrates the light to a small spot adjacent to an air bearing surface 26 of the slider, where it is used to heat a portion of an adjacent storage medium. A near-field transducer (NFT) can be included adjacent to the air bearing surface to further concentrate the light. The laser diode is shown as a rectangular structure which is bonded to the bottom of the cavity by solder bumps 28. Gaps are formed between the laser diode and side walls of the cavity. In one example, the gap between the laser output facet and an optical coupler interface is about 0.1 µm to about 1 µm and the gap around the rest of the laser body may be in a range of about 5 µm to about 20 µm to allow for acceptable pick and place positioning. The methods and apparatus describe below provide protection even when there are variations in interface dimensions.

FIG. 2 is a cross-sectional view of a portion of the integrated laser-in-slider read/write head of FIG. 1. The laser 12 is shown to be positioned in a cavity 14. A gap 30 is formed between the output facet 22 and an input coupler 32 (e.g., the cavity sidewall) that couples light from the laser into the slider waveguide 20. Another gap 34 is formed between the opposite end 36 of the laser and a wall 38 of the cavity. The laser is bonded to the bottom of the cavity using solder bumps 28, which can also provide electrical connections to the laser. Mechanical standoffs are included for laser height positioning. These standoffs also define an underside gap 42. In one example, the gap 30 can range from about 0.25 µm to about 1 µm, and the gap 34 can range from about 5 µm to about 10 µm.

In one embodiment, the disclosure encompasses the use of a sacrificial material in the laser gap (which may be patterned) to allow coating of a subsequent permanent protection layer. A sacrificial layer can be used to temporarily provide a gap-filling, bridge structure for a subsequently applied encapsulating material to coat over, without coating the laser face. The sacrificial layer is subsequently removed to keep the laser/coupler face free of additional material. In one embodiment, a thermally decomposing sacrificial material is used to minimize any harmful residue on the laser facet surface (although other methods of sacrificial material schemes can be used). To describe this method in more detail, an embodiment of a cavity/laser structure is described in more detail. This is followed by a description of the steps in an example embodiment of this encapsulation method.

In one example shown in FIGS. 3, 4 and 5, a laser 50 is mounted in a deep vertical cavity 52 in the trailing end of a slider 54. Pillars 56 are positioned at the bottom of the cavity. The laser is positioned on the pillars. The pillars provide mechanical support and location definition for the assembled laser. A bonding method, such as the solder bumps shown in FIG. 2, can be used to provide mechanical and electrical connection of the laser to the slider. FIG. 5 is a plan view of the laser diode and end of the slider showing gaps 58, 60, 62 and 64 between the laser diode and the cavity walls. In one example, the cavity is about 27 µm deep, the pillars are about 5 µm high, and the laser is about 100 µm tall. The gap 58 between the laser emission edge (i.e., the output facet 61) and the cavity wall 63 can range from about 0.5 µm to about 1 µm. Gaps 60, 62 and 64 can be for example about 10 µm, about 10 µm and about 20 µm respectively. The gaps provide adequate positioning space during laser assembly.

It is desirable to prevent particles from entering the gaps, especially at the light emission edge. The gap between the light emission output surface 66 (also called an output facet) and optical coupler input surface 68 (e.g., the cavity edge) for the waveguide 70 should ideally be empty of material to minimize adverse effects on optical performance. Any material inside this gap may reduce the light coupling efficiency or cause a reliability issue since the temperature is very high at the light emission region.

In one aspect, the disclosure provides an encapsulation process that forms an empty emission edge gap using sacrificial material. First the laser diode and a portion of the trailing surface of the slider are coated with a layer of optical definable and thermal sublimation sacrificial coating material 72, for example a sacrificial polymer such as Unify 2203P available from Promerus, LLC, as shown in FIG. 6. Then the coating material is patterned to leave a portion of the coating material at light emission area, as shown in FIGS. 7 and 8.

Next the material is removed from the top and sidewall of the laser diode with for example a high angle etch (e.g., a mill) to produce the intermediate structure of FIG. 9. Then the assembly is coated with an optical patternable encapsulation layer 74, for example Avatrel 2585P from Promerus, LLC, as shown in FIG. 10. Avatrel 2585P is a negative tone photodefinable electronic material. Two holes 76, 78 are opened over the area containing the sacrificial coating material 72 with standard photolithography.

The coating material 72 is then removed, for example by thermal sublimation or by chemical solution, and the encapsulation layer 74 is coated with the same material again to form layer 80 in FIG. 11 to patch the two holes. The etch release hole size and position need to be designed so that the second coating would not deposit into the light emission area 82 where light exits the output facet of the laser. A wide variety of non-sacrificial, coating materials could be used for this encapsulation including evaporated metal, $SiO_2$, or $Al_2O_3$. The optical materials could be $SiO_2$, $Al_2O_3$, $SiON_x$ etc., deposited by chemical vapor deposition or atomic layer deposition etc.

While an embodiment has been described using the Unity 2203P thermally decomposing sacrificial material, one skilled in the art could implement this method using other sacrificial materials and removal methods including, but not limited to: $SiO_2$ removed by dissolving it in anhydrous HF/alcohol vapor, or silicon removed by $XeF_2$ gas.

FIG. 12 is a flowchart that illustrates the steps used to fabricate the structure of FIG. 11. The process begins by positioning a laser in the cavity in an end of a slider (block 400), wherein the laser has an output facet positioned adjacent to a first wall of the cavity to define a first gap between the output facet and the first wall of the cavity. Then a sacrificial material is inserted into the first gap (block 402). The structure is coated with an encapsulation layer (block 404). Openings are formed in the encapsulation layer to expose the sacrificial material (block 406). Then the sacrificial material is removed (block 408) and the openings are filled (block 410). The laser is this fixed in the cavity with an unfilled gap between the output facet of the laser and the first wall of the cavity. A waveguide or waveguide coupler can be positioned adjacent to the first wall of the cavity such that light exiting the output facet of the laser is coupled to the waveguide.

In another aspect, the disclosure provides a process that does not use a sacrificial layer, but rather plugs the narrow gap near the laser output/coupler interface using directional deposition of a sealing material (e.g. $Al_2O_3$, $SiO_2$, etc.). The structure is similar to that described above, except that this method may allow for a narrower gap since the top of the gap is "plugged", that is, not completely filled down to the laser interface. While this is a similar structure to the structures shown above, the deposition method may allow for even narrower gaps (for example about 0.1 µm) between the laser diode and optical coupler compared to the other methods. The following steps describe an embodiment of the process.

A photo process is used to mask the areas outside the cavity and laser. This is shown in FIGS. 13, 14 and 15, wherein FIG. 13 is a plane view of a laser diode 100 in a cavity 102 in a trailing end of a slider 104, and FIGS. 14 and 15 are side views of alternative embodiments. FIG. 13 shows a patterned photoresist 106 with an open laser cavity area. Gaps 108, 110, 112 and 114 are formed between the laser diode and the walls of the cavity. In this example, the gap 108 between the laser emission edge log and the cavity wall can range from about 0.1 µm to about 1 µm. Gaps 110, 112 and 114 can be for example about 10 µm, about 10 µm and about 20 µm respectively. The gaps provide adequate positioning space during laser assembly.

FIG. 14 shows a side elevation view of the structure of FIG. 13. FIG. 15 shows side elevation view of the design with a bump or spacer 116 against the laser facet edge. The use of a patterned photoresist is an optional step when deposition is not desired for the outside areas.

A controlled angle deposition is used to deposit a layer 118 that plugs the laser facet side gap 108 around bumps 116, to produce the intermediate structures shown in FIGS. 16 and 17. Bump 116 can be on the laser and/or the side of the cavity. The bumps can be positioned on opposite sides of the laser facet 117, and used as spacers to maintain a fixed distance between the laser facet and the side of the cavity. The deposited layer may be $Al_2O_3$, $SiO_2$ or a multilayer of metal and/or oxide in order to optimize the adhesion and balance the thermal response of adjacent components. This step can be followed by resist lift off if applicable. Evaporative deposition offers line-off-sight deposition so that the deposition coverage could be controlled by controlling the deposition angle with a specially designed fixture and its rotation during deposition.

FIGS. 16 and 17 show an example of using a 45 degree deposition with a stationary fixture. A single deposition angle or combinations of multiple angles may be used to achieve the desired coverage. The coating thickness could range from about 0.5 µm to about 1.5 µm depending on the gap width at the laser facet side. FIG. 18 is a top view and FIG. 19 as side view of the structure of FIGS. 16 and 17 after resist lift off.

Next a sealer can be applied to fill the gaps. The sealer would prevent contamination or particles from entering or accumulating underneath the laser. One potential sealer materials is a light curable adhesive, which may be applied through a needle type applicator. The adhesive can cure with light (e.g., visible or UV) exposure by forming a semi-rigid or flexible bond in a time frame of seconds, dependent upon the selection of adhesive. Such solvent free adhesives also eliminate the concern of chemical contamination on the laser facet due to volatile solvent during heating based curing.

The sealer could also be other organic or inorganic coatings applied by deposition, spray coating, etc., followed by some sort of curing process if required. Another sealing material could be a non-directional, thick non-outgassing oxide or metal. The key requirements are (1) no contamination to the laser surface during deposition or curing and (2) a thicker deposition than the gap between the bottom of the cavity and the bottom of the laser. FIGS. 20 and 21 show an example of using an adhesive 120 as a filler in a completed structure. Any thick, non-outgassing material could be considered instead of an adhesive.

FIG. 22 is a flowchart that illustrates the steps used to fabricate the structure of FIG. 21. The process begins by masking an area around a cavity in an end of a slider with a photoresist (block 420). Then a laser is positioned in the cavity (block 422), wherein the laser has an output facet positioned adjacent to a first wall of the cavity to define a first gap between the output facet and the first wall of the cavity. A layer of material is then deposited over the structure using a controlled angle deposition (block 424). The material plugs the first gap. A lift off process can be used to remove the photoresist and the layer of material deposited on the photoresist (block 426). Then a sealing material can be applied to fill the gaps around the laser, other than the first gap (block 428). The laser is thus fixed in the cavity with an unfilled gap between the output facet of the laser and the first wall of the cavity. A waveguide or waveguide coupler can be positioned adjacent to the first wall of the cavity such that light exiting the output facet of the laser is coupled to the waveguide.

In another aspect, the disclosure provides a method similar to that described above except that a conformal material is deposited first such that it fills the gap between the laser facet output and the optical coupler input (e.g., the side of the cavity) with an optically preferred material. This method has the advantage of protecting the laser output facet. A subsequent sealing method would be an option since the laser output surface is protected. However, a sealing material would prevent chemical and particle contamination under the laser structure to minimize the risk of shorting or other reliability damage. FIG. 21 shows a structure formed using a conformal deposition of an optically preferred material 130 (e.g. $SiO_2$). A thermally conductive material 132 can be deposited between the laser and the slider. Material 130 would be typically deposited prior to a second encapsulation deposition encasing the laser diode in a larger-filling capable encapsulant. Material 130 fills a gap 134 between the laser output facet 136 and a waveguide coupler 138 that terminates adjacent to a side 140 of the cavity.

As can be seen from the above description in one aspect, the disclosure utilizes a patternable sacrificial material to fill the area around the laser diode output/coupler input gap to allow a subsequent deposition or coating of a permanent material. The sacrificial material is subsequently removed.

In another embodiment, a non-conformal (e.g., directional) deposition to is used plug the top of a narrow gap that is formed between the laser diode output surface and the coupler interface. Subsequently, a filler material can then be coated to fill the non-critical interface.

In another embodiment, a conformal deposition of an optically preferred material (e.g. $SiO_2$) is used to completely fill the narrow gap that is formed between the laser diode output facet and the coupler interface. Subsequently, a filler material can then be coated to fill the non-critical interface if desired, but may not be required.

A highly thermally conductive final coating material (e.g., a metal) can be applied to maximize thermal conduction to the slider body, or to thermal studs built into the trailing edge of the slider body.

In another aspect, the disclosure provides methods and apparatus for protecting and encapsulating integrated laser diodes in heat-assisted magnetic recording read/write heads. The methods are based on the concept of assembling a protective cap structure over the laser diode. This may be performed by assembling caps individually on each laser (before or after laser assembly) or through a batch assembly to an entire processing bar.

Figure 24:
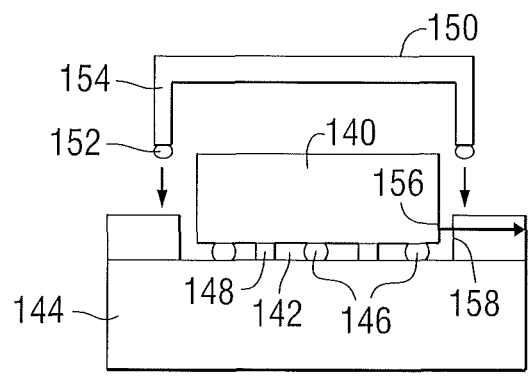
Figure 25:
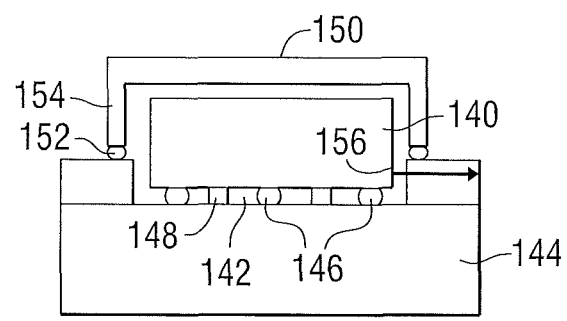

The following description describes several methods of protecting mounted laser diodes on read/write heads by using a capping structure. FIGS. 1 and 2 show an example of a integrated laser-in-slider structure without a cap. FIGS. 24 and 25 show a diagram of how a capping structure could be placed and bonded over the laser/cavity. FIGS. 24 and 25 show a laser diode 140 in a cavity 142 in a trailing end of a slider 144. The laser diode is mounted in the cavity using solder pads 146 and standoffs 148. A cap 150 is positioned over the laser diode. The cap includes a bonding material 152 on the bottom edges of the sides 154 of the cap. In this embodiment, the bonding material is on the cap prior to assembly, and a pick and place assembly device places the cap over the laser and the laser cavity. The laser output facet 156 is positioned to direct light onto a waveguide coupler 158.

The primary role of the cap structure is to prevent particle, liquid, and gas contamination from reaching the laser facets to ensure high laser reliability. Any material that performs this function can be used for the cap. By using a cap structure, the interfacing/sealing surfaces of the laser diode with respect to the slider body are also changed. For example, rather than a vertical gap that is difficult to fill, the cap can create a horizontal gap/interface that is more easily sealed by either bonding materials on the horizontal surface or an outer coating. This can allow for alternative sealing mechanisms.

Figure 26:
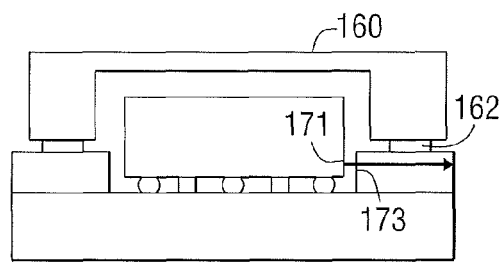
Figure 27:
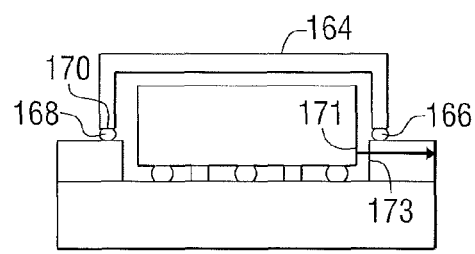

FIGS. 26-31 show a number of these configurations for a capping structure. In all of these embodiments, the choice of bonding and/or sealing materials has many possibilities such as adhesives, metals, oxides, solder, etc. FIG. 26 shows a cap 160 with a wide bonding area 162. Such a cap can be formed by etching a pocket in a thicker material. FIG. 27 shows a cap 164 with a narrower bonding area 166. In this case, an adhesive can be applied to the cap by dipping or depositing a metal or bonding material 168 to the edges 170 of the cap. The laser output facet 171 is positioned to direct light onto a waveguide coupler 173.

Figure 28:
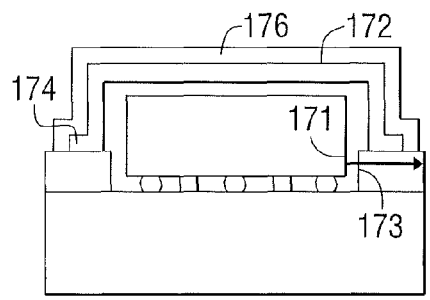
Figure 29:
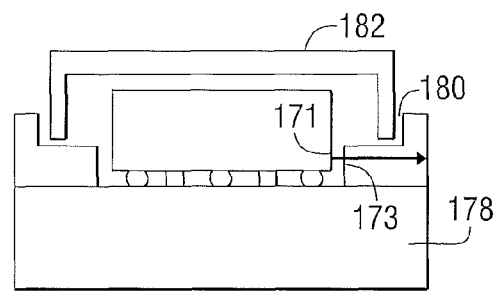
Figure 30:
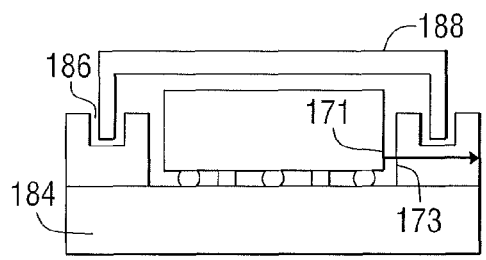
Figure 31:
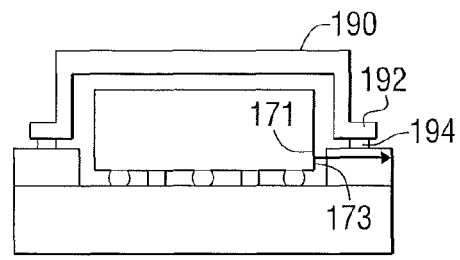

FIG. 28 shows a cap 172 with a flange 174 around the edge. A sealing adhesive 176 or other coating is applied over the cap to bond the cap to the slider. FIG. 29 shows a slider 178 with a pocket 180 for receiving the cap 182. FIG. 30 shows a slider 184 with slots 186 for receiving the cap 188. FIG. 31 shows a cap 190 with a flange 192 for providing a bonding surface 194. Such a cap can be formed by stamping a thin metal sheet or by using a metal mold.

In the structures of FIGS. 26-31 various types of bonding material can be used. FIGS. 26-31 show examples of various interfaces and mechanical references that are created by different cap geometries that can aid self-alignment or define interfaces.

Figure 32:
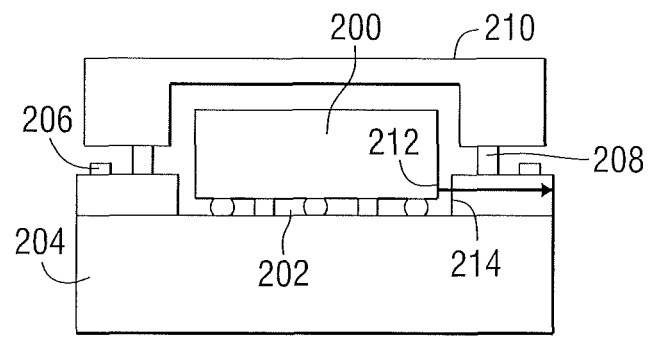
Figure 33:
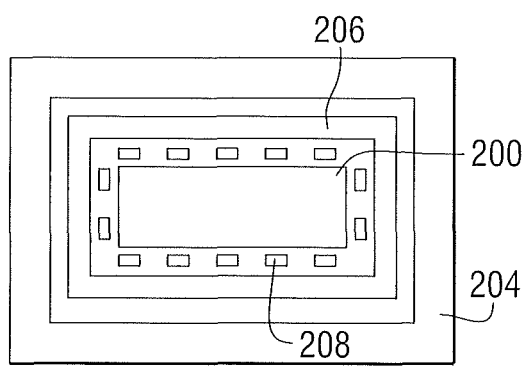
Figure 34:
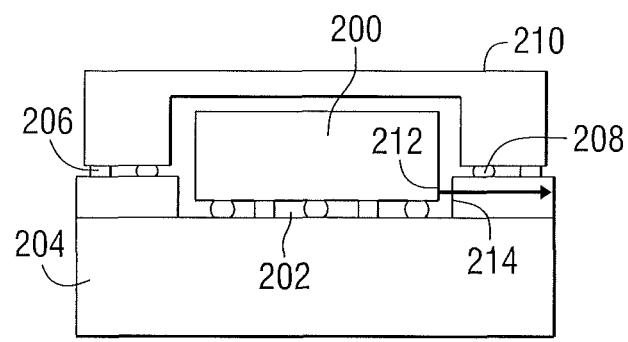

FIGS. 32, 33 and 34 show an embodiment where a patterned solder or non-outgassing bonding material is used to both bond the cap over the laser, and to also form the sealing barrier. Again, a laser 200 is positioned in a cavity 202 in a trailing end of a slider 204. A bonding material 206 can form a sealing ring around the laser. Additional non-sealing bonding pads 208 can be added for electrical, thermal, or mechanical connections.

A 2-step sealing process could be used to allow for sequential assembly and then evacuation/reflow and bonding. In this method, one material 208 is used for the tacking of the cap 210 to the structure and a second material 206 forms the sealing interface for additional temperature, pressure, UV curing, or some other bonding and curing activation method. FIG. 32 shows bonding pads 208 that tack the cap to the slider. Then the cap is pushed toward the slider such that the sealing ring is brought into contact and seals with the cap. This could be done under a vacuum or inert environment with a "getter" material. FIG. 33 shows a final configuration where the bonding material forms a sealing ring as part of a 2-step sealing process. The first material 208 can be in the form of collapsible solder bumps that flatten when the cap is pushed toward the slider. The laser output facet 212 is positioned to direct light onto a waveguide coupler 214.

FIG. 35 is a flowchart that illustrates the steps used to fabricate the structure of FIG. 34. The process begins by positioning a laser in a cavity in a slider or other structure (block 430), wherein the laser has an output facet positioned adjacent to a first wall of the cavity to define a first gap between the output facet and the first wall of the cavity. A bonding material 206 is applied around the cavity (block 432). The bonding material 206 will form a sealing ring around the laser. Additional non-sealing bonding pads 208 are applied around the cavity (block 434). The non-sealing bonding pads have a height that is greater than the sealing ring height. Then a cap is placed over the laser (block 436). The cap makes contact with the non-sealing bonding pads that tack the cap to the structure. The assembly can be placed in a vacuum or an inter gas environment. The cap is then pushed or otherwise moved toward the slider such that the non-sealing bonding pads collapse and edges of the cap contact the sealing ring. Then the sealing ring seals the cap to the structure. The entire process, or just the sealing step could be done under a vacuum or inert gas environment with a "getter" material. The non-sealing bonding pads can be used for electrical, thermal, or mechanical connections. In one embodiment, the non-sealing pads can be collapsible solder. A waveguide or waveguide coupler can be positioned adjacent to the first wall of the cavity such that light exiting the output facet of the laser is coupled to the waveguide.

The cap can be dipped or coated in adhesive prior to attaching it to the slider. A 2-step bonding and sealing method can be used to allow for separate attach and sealing. This can provide the option for implementation using a controlled inert or evacuated environment.

Figure 37:
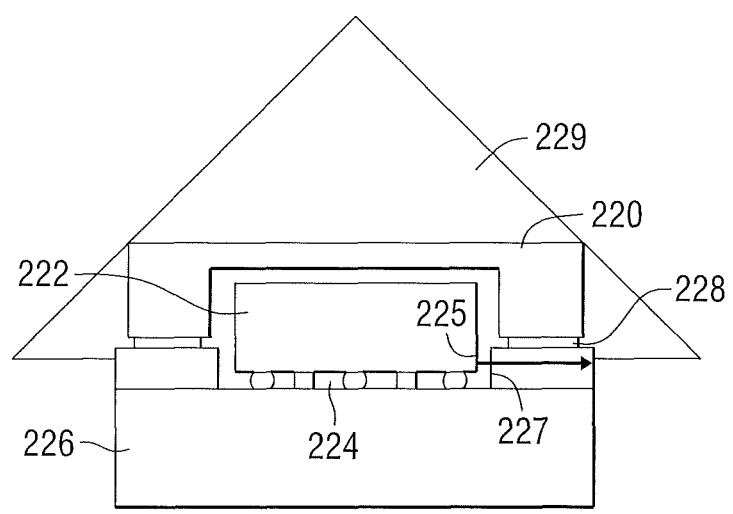

FIGS. 36 and 37 show an embodiment where a transparent capping layer 220 is used and ultraviolet light (UV) curing cures the UV-sensitive bonding material. A laser 222 is positioned in a cavity 224 in a trailing end of a slider 226. A bonding material 228 can form a sealing ring around the laser. UV light 229 is directed onto the assembly. The transparent cap material is used to enable UV activation/curing of the cap bonding. UV curable adhesive can be employed in combination with a transparent cap material with minimal outgassing to prevent contamination on the laser facet. The laser output facet 225 is positioned to direct light onto a waveguide coupler 227.

Figure 38:
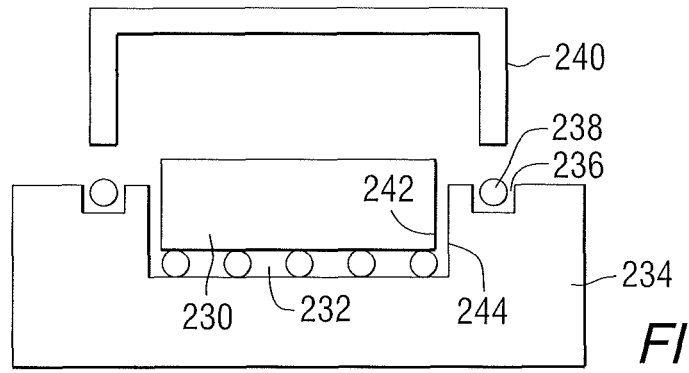

FIG. 38 illustrates the use of a trench to guide the cap structure and constrain the adhesive/solder/bonding material. A laser 230 is positioned in a cavity 232 in a trailing end of a slider 234. The slider includes a trench 236 that surrounds the cavity. A bonding material 238 is positioned in the trench. The cap 240 is then brought into contact with the bonding material. The shallow trench is put into the target substrate to aid in the alignment of the cap and guiding of the adhesive or solder. The laser output facet 242 is positioned to direct light onto a waveguide coupler 244.

Figure 39:
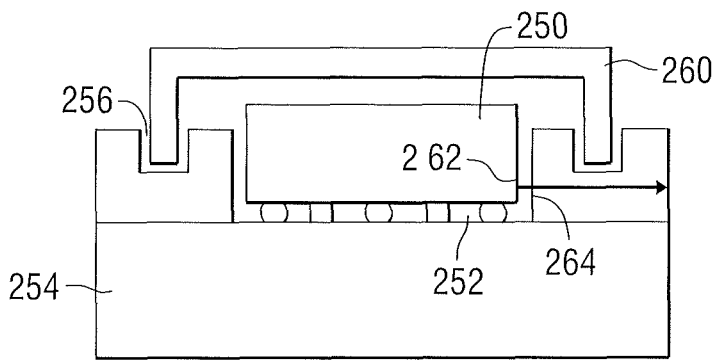

A groove in the bonding cap structure can be used to control adhesive flow, partially or fully control mechanical positioning, and/or change the sealing surface to allow for beneficial (i.e. easier to seal) interfaces. FIG. 39 shows an example using a trench to guide the cap structure and create a sealable interface. A laser 250 is positioned in a cavity 252 in a trailing end of a slider 254. The slider includes a trench 256 that surrounds the cavity. A bonding material 258 is positioned in the trench. The cap 260 is then brought into contact with the bonding material. The shallow trench is formed in the target substrate to aid in the alignment of the cap and in guiding the adhesive or solder. The laser output facet 262 is positioned to direct light onto a waveguide coupler 264.

The cap can include a vertical interface positioned against a slider surface, or a horizontal interface surface against a slider surface.

Figure 40:
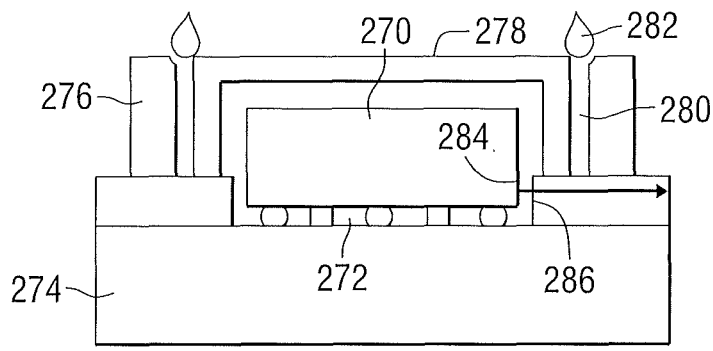
Figure 41:
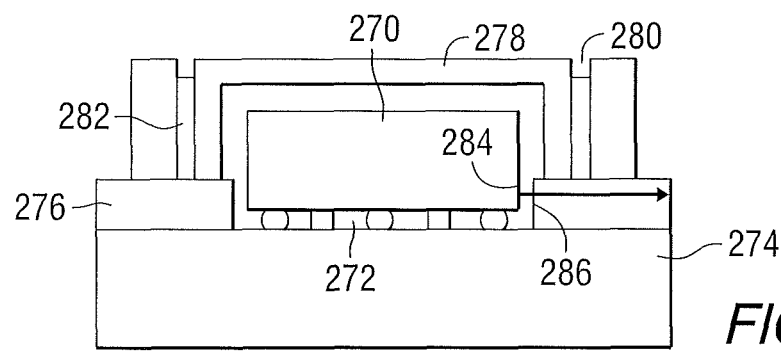

FIGS. 40 and 41 show an embodiment where adhesive wicking paths are created in the cap to allow for simple adhesive dispensing on the top of the cap over a hole followed by a natural "wicking" of the adhesive down into the interface between the cap and the substrate. A laser 270 is positioned in a cavity 272 in a trailing end of a slider 274. The slider includes a structure 276 that surrounds the cavity. The cap 278 is then positioned to form an opening 280 between sides of the cap and the structure 276. A bonding adhesive 282 is applied to the opening and wicked into the opening. The "wicking channels" allow for self-controlled capillary action of the adhesive to seal the cap structure. The laser output facet 284 is positioned to direct light onto a waveguide coupler 286.

FIG. 42 illustrates a process wherein the caps are assembled in a 1-dimensional (1-D) array such that the caps can be batch-assembled onto a corresponding bar or wafer. The process begins with a bar 290 including a plurality of sliders 292 in a 1-dimensional array. Lasers 294 are placed into cavities in the sliders. Then a 1-dimensional array of caps 296 is placed over the lasers, and the resulting assembly is diced to separate the sliders. In another example, a 2-dimensional (2-D) array could allow a wafer-to-wafer bonding method which could provide cost advantages.

Planarization of the laser and use of a flat cap allows a flat cap to be made out of a wafer. Such a flat cap may include microelectronic features such as a photodetector or laser driver circuitry. FIG. 43 shows an embodiment in which the laser 300 is planarized with the target substrate 302, and a flat cap 304 is used. The flat cap could be attached with a bonding material 306, or by fusion bonding. The flat cap could be made out of a wafer and could include microelectronic features such as a photodetector, laser driver, or other useful circuitry. The laser output facet 308 is positioned to direct light onto a waveguide coupler 309.

The cap may be in thermal contact with the laser (e.g., through solder or other thermally conductive material) where the cap acts as a heat sink. FIG. 44 shows an embodiment in which the cap 310 is thermally connected to the laser 312 by a thermally conductive material 314. The cap then acts as a heat sink to remove heat from the laser. The cap may alternatively be in direct contact with the laser for thermal transfer. The cap may have a relatively large thermal mass, and it may conduct heat to the slider body 316 through the side walls 318 of the cap, or it may have features which increase the cap's surface area to improve convective cooling. The laser output facet 320 is positioned to direct light onto a waveguide coupler 321.

FIG. 45 shows an embodiment in which the cap 310 is thermally connected to the laser 312 by thermal studs 320 and 322. The cap then acts to remove heat from the laser. The cap may alternatively be in direct contact with the laser for thermal transfer. The cap may have a relatively large thermal mass, and it may conduct heat to the slider body 316 through the side walls 318 of the cap, or it may have features which increase the cap's surface area to improve convective cooling. The laser output facet 324 is positioned to direct light onto a waveguide coupler 326.

In the described example, the cap substrate array may be made from a substrate with a material having a similar coefficient of thermal expansion (CTE) as the head (e.g. glass). The cavity recessions could be formed by sandblasting or laser milling. One-dimensional or 2-dimensional arrays could be assembled to a bar or wafer. Alternatively, the cap can be used as a submount for the laser, allowing test and burn-in prior to attach. Passive alignment features (e.g., solder bumps and vertical stoppers) could be used on both the laser and the cap.

Ultrasonic bonding (i.e., non thermal bonding) can be used to minimize heat damage to the head or reflow of the laser solder attachment. In another example compression bonding such as gold/gold bonding can be used. A solder bonding material can be used to minimize outgassing with no organic contamination on the laser output facet. A dry-film (e.g., patterned) adhesive can be used to minimize outgassing. Alternatively, localized heating can be used for bonding the cap (using for example, reactive foil, patterned resistive heaters on the slider or cap, or laser soldering/welding).

The cap can be formed by punching a thin sheet of material (e.g. metal), or by etching, milling, or sandblasting a cap material. A vacuum-deposited oxide material (e.g. $SiO_2$, $SiN_x$) can be used for coating or sealing the cap, or to create a bonding material (e.g. glass frit, direct bonding).

While the disclosure has been described in terms of several examples, it will be apparent to those skilled in the art that various changes can be made to the described examples without departing from the scope of the following claims. The implementations described above and other implementations are within the scope of the following claims.

What is claimed is:

1. A method comprising:
   positioning a laser in the cavity in an end of a slider, wherein the laser has an output facet positioned adjacent to a first wall of the cavity to define a first gap between the output facet and the first wall of the cavity; and
   filling at least a portion of the first gap adjacent to the output facet.

2. The method of claim 1, wherein the step of filling at least a portion of the first gap adjacent to the output facet comprises:
   coating the laser and a portion of a trailing surface of the slider with a layer of sacrificial material;
   patterning the sacrificial material to leave a portion of the sacrificial material adjacent to the output facet;
   coating the sacrificial material with an encapsulation material; and
   removing the sacrificial material.

3. The method of claim 2, wherein the step of removing the sacrificial material comprises:
   forming a hole in the encapsulation material; and
   thermally decomposing or dissolving the sacrificial material to remove the sacrificial material through the hole.

4. The method of claim 2, wherein the step of patterning the sacrificial material comprises:
   removing portions of the sacrificial material with a high angle etch.

5. The method of claim 2, wherein the sacrificial material comprises one of:
   a sacrificial polymer, $SiO_2$, or silicon.

6. The method of claim 1, wherein the step of filling at least a portion of the first gap adjacent to the output facet comprises:
   plugging the first gap using directional deposition of a sealing material.

7. The method of claim 1, further comprising:
   depositing a thermally conductive coating material between the laser and the slider.

8. An apparatus comprising:
   a slider including a cavity in a trailing end of the slider;
   a laser positioned in the cavity and having an output facet positioned adjacent to a first wall of the cavity to define a first gap between the output facet and the first wall of the cavity; and
   a sealing material filling at least a portion of the first gap adjacent to the output facet.

9. The apparatus of claim 6, wherein the laser is positioned in the cavity to define additional gaps between the laser and additional walls of the cavity; and
   the sealing material fills at least a portion of each of the additional gaps.

10. The apparatus of claim 8, further comprising:
spacers in the first gap between the laser and the cavity.

11. The apparatus of claim 10, wherein the spacers are positioned on opposite sides of the output facet.

\* \* \* \* \*